(12) United States Patent
Han

(10) Patent No.: US 9,394,600 B2
(45) Date of Patent: Jul. 19, 2016

(54) MASK ASSEMBLY FOR DEPOSITION

(71) Applicant: Samsung Display Co., Ltd., Yongin-si, Gyeonggi-do (KR)

(72) Inventor: Jeong-Won Han, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/227,435

(22) Filed: Mar. 27, 2014

(65) Prior Publication Data

US 2014/0373780 A1 Dec. 25, 2014

(30) Foreign Application Priority Data

Jun. 19, 2013 (KR) ........................ 10-2013-0070441

(51) Int. Cl.
*B05C 21/00* (2006.01)
*C23C 14/04* (2006.01)
*C23C 16/04* (2006.01)

(52) U.S. Cl.
CPC ............. *C23C 14/042* (2013.01); *B05C 21/005* (2013.01); *C23C 16/042* (2013.01)

(58) Field of Classification Search
None
See application file for complete search history.

(56) References Cited

U.S. PATENT DOCUMENTS

| 6,650,037 B1 * | 11/2003 | Reed et al. | ..................... 313/406 |
| 2002/0025406 A1 * | 2/2002 | Kitazume | ..................... 428/136 |

FOREIGN PATENT DOCUMENTS

| KR | 10-2002-0016599 | | 3/2002 | |
| KR | 10-2006-0102092 | | 9/2006 | |
| KR | 10-2006-0114463 | | 11/2006 | |
| KR | 10-2006-0114602 | | 11/2006 | |
| KR | 10-2007-0064906 | | 6/2007 | |
| KR | 10-2007-0082317 | | 8/2007 | |
| KR | 1020070082317 | * | 8/2007 | ............ H05B 33/10 |
| KR | 10-0853544 | | 8/2008 | |
| KR | 10-2012-0069396 | | 6/2012 | |

* cited by examiner

*Primary Examiner* — Dah-Wei D Yuan
*Assistant Examiner* — Jethro M Pence
(74) *Attorney, Agent, or Firm* — Knobbe Martens Olson & Bear LLP

(57) ABSTRACT

A deposition mask assembly includes: a mask in which a deposition pattern is formed and a mask frame fixed to an edge of the mask, an opening being formed at a center of the mask frame. A first surface of the edge of the mask and a first surface of the mask frame adjacent to the opening which face each other are welded to each other.

5 Claims, 5 Drawing Sheets

MASK ASSEMBLY FOR DEPOSITION

CROSS-REFERENCE TO RELATED APPLICATIONS

This application claims priority to and the benefit of, Korean Patent Application No. 10-2013-0070441 filed in the Korean Intellectual Property Office on Jun. 19, 2013, the entire content of which is incorporated herein by reference.

BACKGROUND

1. Field

The present disclosure relates to a deposition mask assembly.

2. Description of the Related Technology

A display device, such as for example an organic light emitting diode (OLED) display, is manufactured by depositing a thin film on a substrate. A deposition mask assembly employed for depositing a thin film of the display device is typically manufactured by using an etching method applying photolithography and an electroforming method using photolithography and electrolysis. Such a deposition mask assembly is located at the substrate on which a target object, such as for example, a display element, is to be formed, and a deposition object is transferred to the substrate through the deposition mask to thereby deposit a desired type of pattern on the substrate.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

Embodiments of the present invention have been made in an effort to provide a deposition mask assembly having advantages of being capable of preventing damage to a substrate adhered to a top surface of a mask caused by a weld bead protruding toward the top surface and damage to a deposition pattern formed in the mask caused by welding between the mask and a mask frame.

One embodiment provides a deposition mask assembly including: a mask in which a deposition pattern is formed; and a mask frame fixing to an edge of the mask, an opening being formed at a center of the mask frame, wherein a first surface of the edge of the mask and a first surface of the mask frame adjacent to the opening which face each other are welded to each other A plurality of welding holes may be formed to extend through the first surface of the mask frame.

The welding holes may be formed along a circumference of the opening.

The opening may have a quadrangular shape.

The mask frame may further include a second surface downwardly extending from the first surface of the mask frame.

The second surface may form a closed curved line along the circumference of the opening.

The mask frame may further include a third surface facing the second surface of the mask frame.

The third surface may be formed outside the second surface when viewed in a direction away from the opening.

A welding rod insertion groove for accommodating a welding rod may be formed between the second surface and the third surface of the mask frame, where the second and third surfaces face each other.

The deposition mask assembly in accordance with one embodiment can prevent damage to a substrate adhered to a top surface of a mask caused by a weld bead protruding toward the top surface, and damage to a deposition pattern formed in the mask caused by welding between the mask and a mask frame.

DETAILED DESCRIPTION OF CERTAIN INVENTIVE EMBODIMENTS

Figure 1:
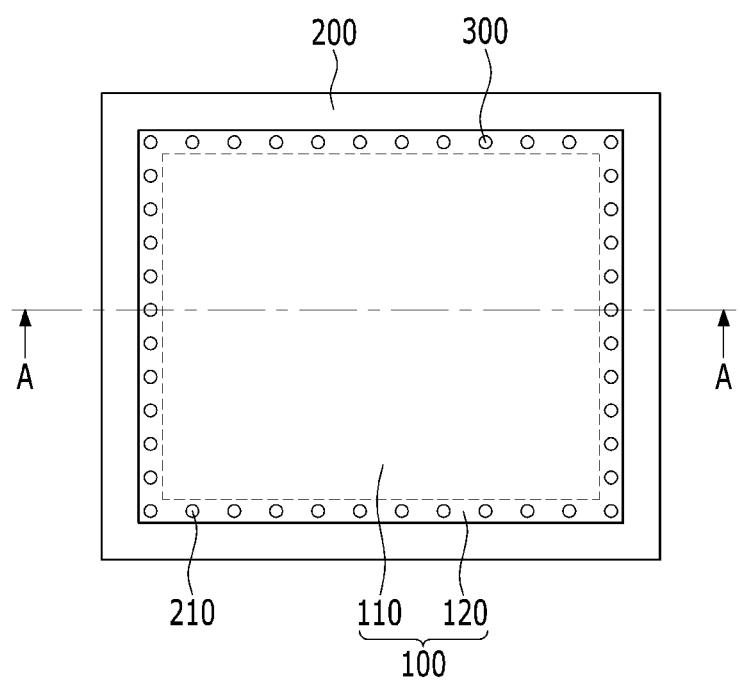
FIG. 1 is a top view of a deposition mask assembly in accordance with an embodiment.

Hereinafter, certain embodiments of the present invention will be described in detail with reference to the attached drawings such that the present invention can be easily put into practice by those skilled in the art. As those skilled in the art would realize, the described embodiments may be modified in various ways, without departing from the spirit or scope of the present invention. In the drawings and this specification, parts or elements that are not related to the description hereof are omitted in order to clearly describe the present invention, and the same or like constituent elements are generally designated by the same reference numerals throughout the specification.

In addition, the size and thickness of each component shown in the drawings are arbitrarily shown for better understanding and ease of description, but the present invention is not limited thereto.

In the drawings, the thickness of layers, films, panels, regions, etc., may be exaggerated for clarity. In the drawings, for better understanding and ease of description, the thickness of some layers and areas may be exaggerated. Further, when a first part of a layer, a film, a plate, or the like is described as being arranged "on" or "over" a second part, this indicates that the first part is arranged on or over the second part directly or with a third part therebetween without the limitation to the upper side thereof on the basis of the gravity direction.

Further, throughout this specification, when a part is described as "comprising" or "including" constituent elements, this indicates that the part may further include other constituent elements unless particularly otherwise defined.

Generally, a mask and a mask frame are welded to be fixed to each other in a mask assembly, and a weld bead is protruded toward an upper side of the mask. Accordingly, in a deposition process, when a substrate is adhered to an upper surface of a mask, the substrate is damaged by the protruded weld bead. Further, in the operation of welding the mask and the mask frame, a deposition pattern may be damaged by welding debris.

Figure 2:
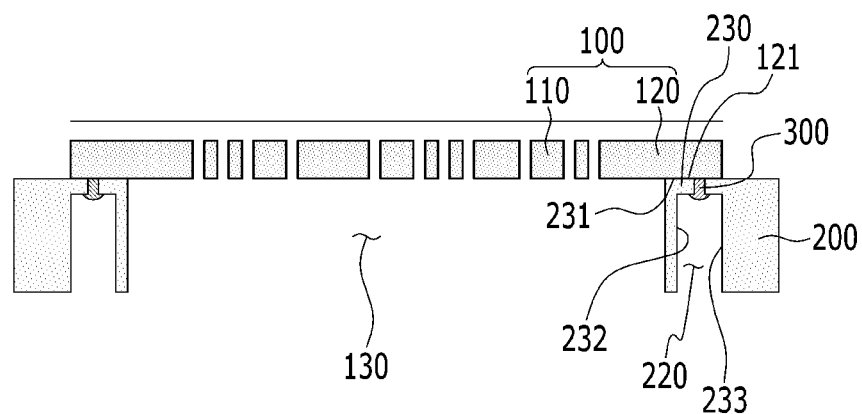
FIG. 2 is a side view of the deposition mask assembly in accordance with an embodiment.

Referring to FIG. 1 and FIG. 2, a deposition mask assembly in accordance with an embodiment can prevent damage to a deposition pattern formed in a mask in a manufacturing operation of the mask assembly. Damage to a substrate serving as a target object to be deposited on, caused by a weld bead formed by the welding of a mask and a mask frame, can also be prevented.

The deposition mask assembly of an embodiment of the invention includes a mask 100 and a mask frame 200.

Referring to FIG. 1, the mask 100 may have a quadrangular plate-like shape. However, the mask 100 may have various shapes without being limited thereto.

In this case, a deposition pattern 110 is formed in the mask 100. In the deposition pattern 110, a plurality of openings extending through the mask surface are formed in the mask surface in a predetermined form. A thin film may be formed in a desired type of pattern on a substrate serving as a target object to be deposited on by depositing fine deposition objects on the substrate through the deposition pattern.

In this case, an edge 120 of the mask 100 is fixed to the mask frame 200. In a deposition process, the mask 100 is strongly fixed to the mask frame 200 so as to allow the deposition pattern 110 formed in the mask 100 to not be moved.

In accordance with one embodiment, a first surface 121 of the edge 120 of the mask 100 is coupled to a first surface 231 of the mask frame 200. Specifically, the first surface 121 of the edge 120 of the mask 100 is coupled to the first surface 231 of the mask frame 200 which faces the first surface 121 thereof.

The edge 120 of the mask 100 is coupled to the mask frame 200 by welding. In accordance with one embodiment, the first surface 121 of the edge 120 of the mask 100 is welded to the first surface 231 of the mask frame 200.

A plurality of welding holes 210 are formed in the mask frame 200 along the first surface 231 of the mask 200.

Figure 3:
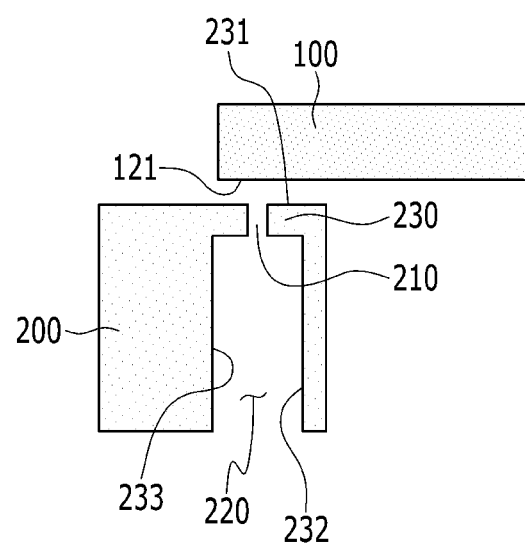
FIG. 3 to FIG. 5 show a coupling process of a mask and a mask frame shown in FIG. 2
Figure 4:
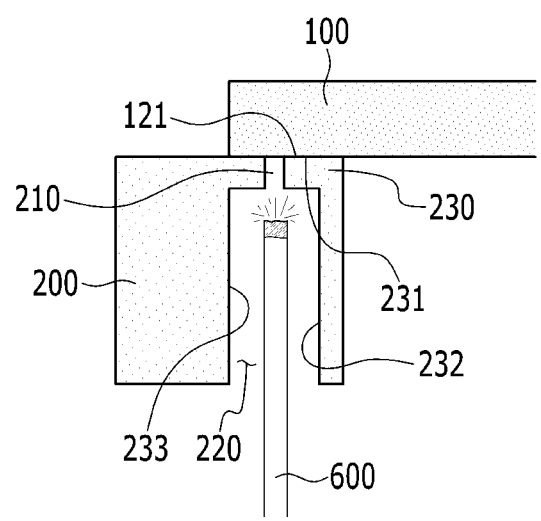

Referring to FIG. 3 and FIG. 4, the welding holes 210 are formed to extend through the first surface 231 of the mask frame 200. The first surface 121 of the edge 120 of the mask 100 which is exposed through the welding holes 210 is welded at a lower side of the mask frame 200 by using a welding rod 600.

As shown in FIG. 2, a weld bead 300 is formed by the welding to protrude toward the lower side of the mask frame 200.

Referring to FIG. 1 and FIG. 2, the mask frame 200 may have a quadrangular frame-like shape. In other words, the mask frame 200 may be of a frame type having a quadrangular opening 130 at its center.

The edge 120 of the mask 100 is fixed to the mask frame 200 such that the deposition pattern 110 of the mask 100 is exposed through the opening 130 of the mask frame 200. In other words, the edge 120 of the mask 100 is fixed to an edge 230 of the opening 130.

Referring to FIG. 2, a second surface 232 is formed to downwardly extend from the first surface 231 of the mask frame 200.

The second surface 232 of the mask frame 200 serves to prevent damage to the deposition pattern 110 by sparks generated while welding. In other words, the second surface 232 of the mask frame 200 serves as a fence for preventing welding sparks from being scattered to the deposition pattern 110.

Specifically, by forming the second surface 232 of the mask frame 200, it is possible to prevent welding sparks generated by the welding from flying to the deposition pattern 110 of the mask 100 through the opening 130 of the mask frame 200.

In this case, the second surface 232 of the mask frame 200 can form a closed curved line along a circumference of the opening 130. Specifically, the second surface 232 is formed to surround the circumference of the opening 130. Accordingly, it is possible to prevent welding sparks from flying to the deposition pattern 110 through the opening.

In accordance with one embodiment, the mask frame 200 may further include a third surface 233 facing the second surface 232. In this case, the third surface 233 is formed outside the second surface 232.

Like the second surface 232, the third surface 233 can form a closed curved line along a circumference of the second surface 232.

As shown in FIG. 2, by allowing the second surface 232 and the third surface 233 to face each other, a welding rod insertion groove 220 can be formed to accommodate the welding rod 600.

By forming the welding rod insertion groove 220, it is possible to prevent welding sparks and the like generated by the welding from being scattered in a side direction, such as for example, in an outside direction of the mask frame 200.

In this case, the welding rod insertion groove 220 may be formed in parallel with the welding holes 210. The welding rod insertion groove 220, as shown in FIG. 2, is formed to have a predetermined depth. Specifically, the welding rod insertion groove 220 has a sufficient depth to prevent sparks and the like generated from the welding rod from being scattered to the deposition pattern 110 of the mask 100.

Figure 5:
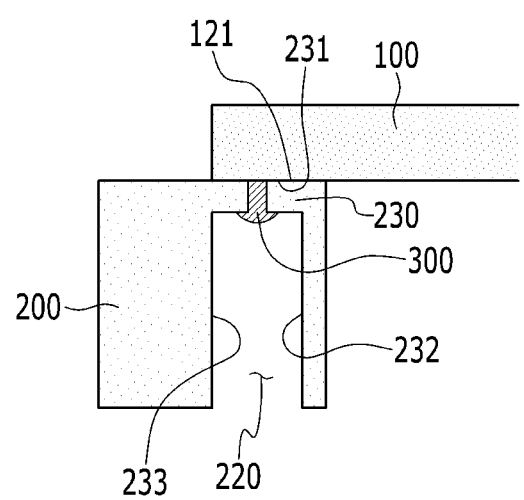

FIG. 3 to FIG. 5 shows operations for fixing the mask 100 to the mask frame 200.

In FIG. 3 and FIG. 4, the edge 120 of the mask 100 is located at an upper side of the edge 230 of the opening 130 of the mask frame 200.

Next, as shown in FIG. 5, by performing welding through the hole 210, the first surface of the edge 120 of the mask 100 is coupled to the first surface 231 of the opening 130.

In this case, as the first surface 121 of the mask 100 is welded, the weld bead 300 is formed to protrude toward the lower side of the mask 100. In other words, as shown in FIG. 6, the weld bead 300 is formed to protrude in a direction opposite to a top surface of the mask 100 that is brought into contact with a substrate 400.

Figure 6:
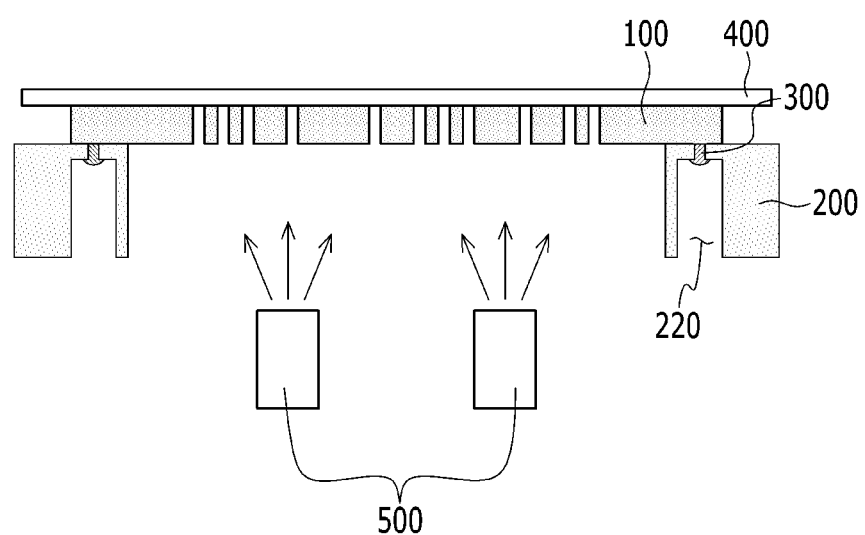
FIG. 6 is a state diagram showing how a deposition process is performed by using the deposition mask assembly in accordance with an embodiment.

Referring to FIG. 6, a process of forming a thin film in a substrate includes a step of bringing the substrate 400 into contact with the top surface of the mask 100, and a step of depositing a fine deposition material from a deposition device 500 at the lower side of the mask 100 on the substrate 400.

In this case, as the weld bead 300 does not exist between the substrate 400 and the top surface of the mask 400, such substrate damage caused by the weld bead 300 can be prevented.

In the deposition mask assembly in accordance with embodiments of the present invention, the weld bead is formed to protrude to the lower side of the mask 100 when the mask 100 is welded to the mask frame 200 so that the substrate damage can be prevented in the deposition operation. Further, it is possible to prevent the deposition pattern 120 of the mask 100 from being damaged by sparks and the like generated by the welding.

While this invention has been described in connection with certain embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 100: mask | 110: deposition pattern |
| 120: edge | 200: mask frame |
| 210: welding hole | 220: welding rod insertion groove |
| 230: edge | 300: weld bead |
| 400: substrate | 500: deposition device |

What is claimed is:

1. A deposition mask assembly, comprising:
a mask in which a deposition pattern is formed;
a mask frame fixing an edge of the mask, wherein the mask frame includes a first surface, a second surface downwardly extending from the first surface, and a third surface facing the second surface;

an opening being formed at a center of the mask frame;

a plurality of welding holes formed to extend through the first surface of the mask frame; and a welding rod insertion groove configured to accommodate a welding rod formed between the second surface and the third surface of the mask frame, wherein the welding rod insertion groove is connected to at least one of the welding holes, and the welding rod insertion groove is opened in the opposite direction of the at least one welding hole, wherein a first surface of the edge of the mask and the first surface of the mask frame adjacent to the opening which face each other are welded to each other.

2. The deposition mask assembly of claim 1, wherein the welding holes are formed along a circumference of the opening.

3. The deposition mask assembly of claim 2, wherein the opening has a quadrangular shape.

4. The deposition mask assembly of claim 1, wherein the second surface forms a closed curved line along the circumference of the opening.

5. The deposition mask assembly of claim 1, wherein the third surface is formed outside the second surface when viewed in a direction away from the opening.

* * * * *